United States Patent [19]

Takayama et al.

[11] Patent Number: 4,963,868
[45] Date of Patent: Oct. 16, 1990

[54] FRAME SYNCHRONIZING METHOD AND SYSTEM

[75] Inventors: Jun Takayama, Tokyo; Katsuichi Tachi, Kanagawa; Hideto Suzuki, Kanagawa; Kenshiro Masuzaki, Kanagawa, all of Japan

[73] Assignee: Sony Corporation, Tokyo, Japan

[21] Appl. No.: 269,482

[22] Filed: Nov. 10, 1988

[30] Foreign Application Priority Data

Nov. 27, 1987 [JP] Japan .................. 62-299385

[51] Int. Cl.$^5$ ............................................. H03M 5/14
[52] U.S. Cl. ......................................... 341/72; 341/68
[58] Field of Search ........................... 341/70, 72, 68; 375/112, 113, 114, 55; 370/100, 105.5; 360/48

[56] References Cited

U.S. PATENT DOCUMENTS

| | | | |
|---|---|---|---|
| 4,045,613 | 8/1977 | Walker | 375/112 |
| 4,072,987 | 2/1978 | Walker | 375/112 |
| 4,124,778 | 11/1978 | Amass | 341/72 |
| 4,353,129 | 10/1982 | Nishiwaki | 375/112 |
| 4,683,586 | 7/1987 | Sakamoto et al. | 375/112 |

*Primary Examiner*—William M. Shoop, Jr.
*Assistant Examiner*—Sharon D. Logan
*Attorney, Agent, or Firm*—Alvin Sinderbrand

[57] ABSTRACT

An original data stream encoded into an M$^2$ coded data stream having a plurality of bit cells has a synchronizing signal with a unique sync pattern based on the logic levels of the original data stream inserted into the M$^2$ coded data stream. The unique pattern forming the synchronizing signal is constructed so as not to appear as a pattern in the combined data stream other that at the locations of the inserted synchronizing signal. As a result, random M$^2$ coded data patterns are not erroneously detected to be a sync pattern, thereby avoiding a synchronization shift and the occurrence of a synchronization error. Accordingly, a correct and stable synchronization can be established so as to enable reproduction of an original data stream with high fidelity.

16 Claims, 11 Drawing Sheets

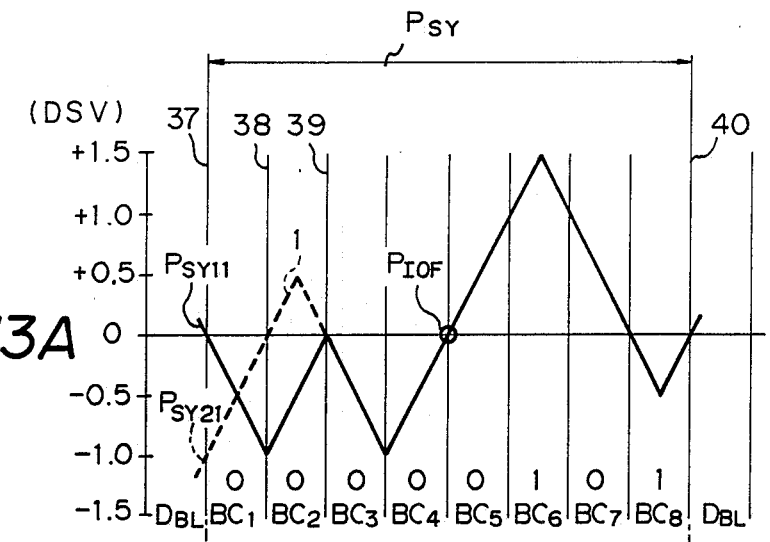
Fig.13A
Fig.13B
Fig.13C
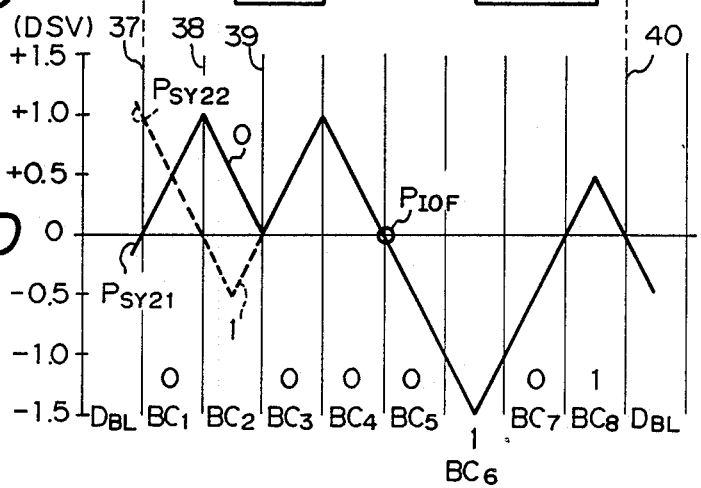
Fig.13D

FRAME SYNCHRONIZING METHOD AND SYSTEM

BACKGROUND OF THE INVENTION

1. Field of the Invention

This invention relates to a frame synchronizing method and system for a data stream that is modulated using an M² code.

2. Description of the Prior Art

There are a variety of conventional digital data modulation systems. One system using an M² code is disclosed in U.S. Pat. No. 4,027,335. The M² code is based on the miller code and is the so-called DC-free code in which a direct current component can be eliminated after modulation.

The M² code is a self-clocking enable code having a minimum inversion interval $T_{min}=T$, a detection window width $Tw=\frac{1}{2}T$, and a maximum inversion interval $T_{MAX}=3T$ ($T_{MAX}/T_{min}=3$) for a bit cell length T and a code having a range for which the data rate does not become high.

As a result, the recording of video data modulated with the M² code onto a tape has generally been performed as part of the digital VTR process. The modulation rule of the Miller code is applied to that of the M² code with an improvement for eliminating a DC component of the data so as to overcome a disadvantage in the Miller code. Basically, a "0" of original data is represented by a first level transition of a bit cell, while a "1" of the original data is represented by an intermediate level transition of the bit cell. Further, with respect to a "0" subsequent to a "1" of the original data, the level transition of the bit cell is suppressed. This is the modulation rule of the Miller code. In the modulation rule of the M² code, the level transition of the last "1", for example, is suppressed to eliminate a DC component of post-modulation data if an even number of "1's" continue after a "0" of the original data. As a result of such modulation, the above-mentioned various conditions are satisfied.

To establish the correct frame synchronization at the time of digital data reproduction a sync pattern which is clearly distinguished from data must be inserted into the data stream. For instance, in an 8-10 modulation system used in RDAT, it is possible to form a unique sync pattern (which does not occur in a data stream). However, in the above-stated M² code, a unique sync pattern is not defined in the encoded data stream. For this reason, a method for inserting a particular (sixteen-bit, for example) sync pattern for frame synchronization between data blocks before encoding has been adopted generally.

As has been mentioned before, since a particular sync pattern is inserted into a data stream, this sync pattern cannot be a unique pattern. Thus, there is a certain probability that the identical pattern may occur in the data stream.

As a result, there is a probability that the above-mentioned data may be detected erroneously as the sync pattern. In short, there is a problem that the synchronization shift and a synchronization error may take place making the establishment of correct synchronization and, as a result, making the correct reproduction of digital data difficult. Also, in a conventional methods, because a particular sync pattern is inserted into data blocks before the M² code encoding then modulated collectively by the M² code, there is a problem that the sync pattern can be detected only after decoding. Therefore, an improvement on this problem has been desired.

OBJECTS AND SUMMARY OF THE INVENTION

An object of the present invention is, therefore, to provide a frame synchronizing method and system for a data stream encoded with the M² code so as to avoid the above-mentioned disadvantages in the prior art.

Another object of this invention is to provide a frame synchronizing method and system capable of preventing a false detection of a frame synchronizing pattern on the decoding and reproducing side.

Still another object of the invention is to provide a frame synchronizing method and system capable of detecting a frame synchronizing pattern before decoding on the decoding and reproducing side.

A further object of the invention is to provide frame synchronizing method and system for enabling frame synchronization to be established with high accuracy and stability on the decoding and reproducing side.

According to an aspect of the present invention, a binary input data stream of a rate of 1/T bits per second is encoded into a binary wave-form using an M² code a frame synchronizing signal is inserted into the M² coded data stream such that the frame synchronizing signal has a unique pattern which does, not appear in the M² coded data stream other than during the frame synchronizing signal. As a result, the frame synchronizing signal can be detected without error prior to the decoding of the M² coded data stream.

BRIEF DESCRIPTION OF THE DRAWINGS

The present invention will be described in more detail with reference to the accompanying drawings in which:

FIG. 6 is a block diagram of a second embodiment of the present invention;

FIG. 13 is a time chart for describing the operation of the second embodiment.

DETAILED DESCRIPTION OF THE INVENTION

Referring to FIGS. 1-5, a first embodiment of this invention will be described hereunder as applied to a sync pattern of 8-bit cells [referring to as 8T].

In the embodiment, an encoded data stream of the M² code is severed at the boundary of arbitrary bit cells and a predetermined sync pattern is inserted between those cells.

Figure 1:
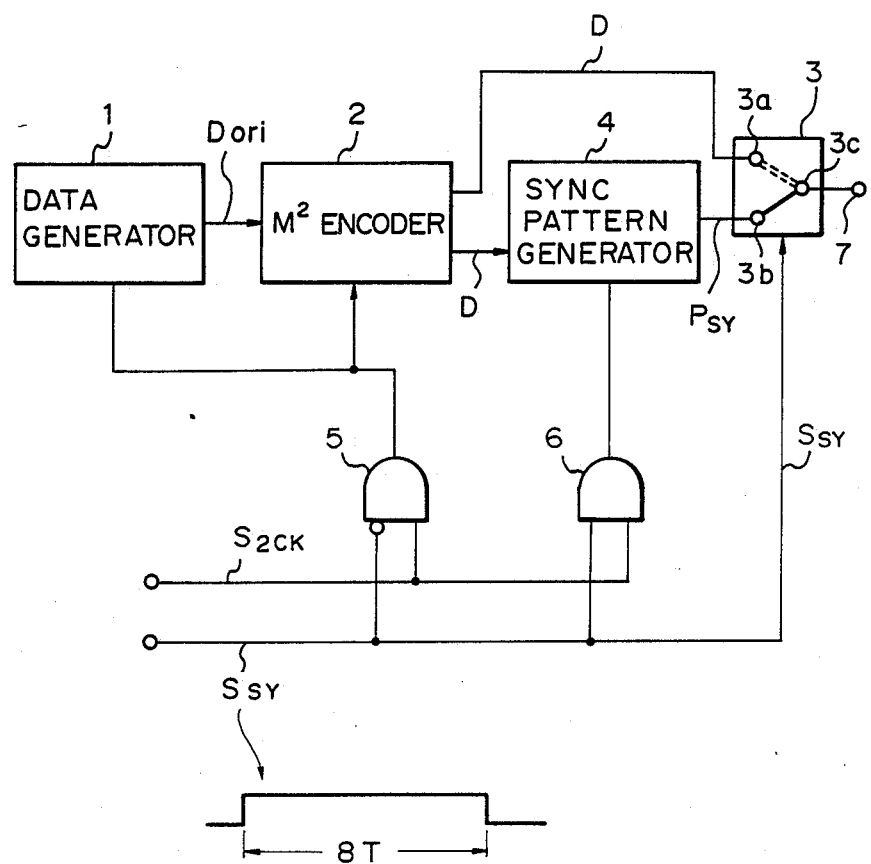
FIG. 1 is a block diagram of a first embodiment of the invention.
Figure 2:
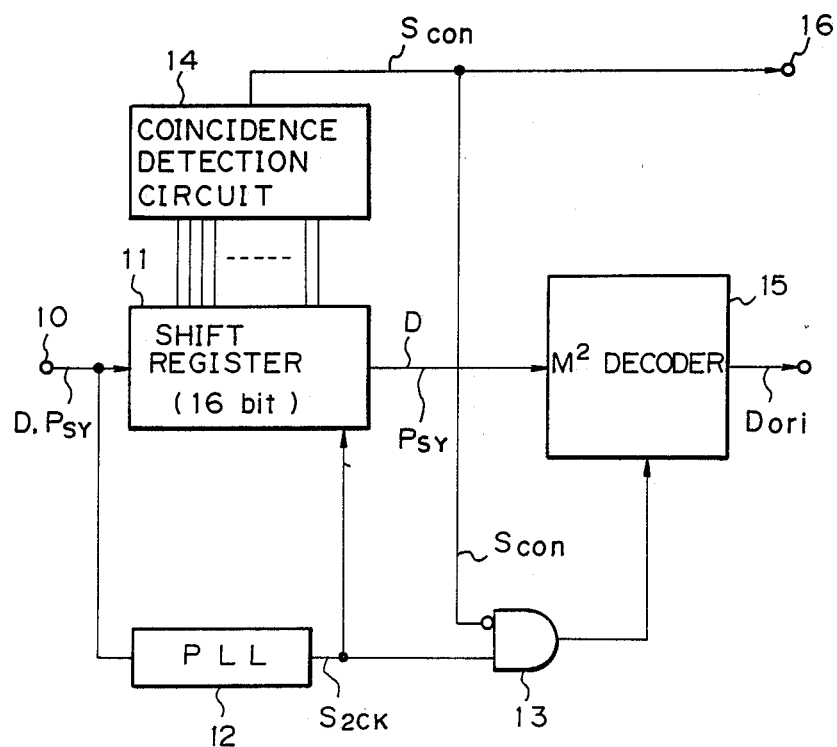

FIG. 1 shows a structure of an encoding side of the frame synchronizing system, while FIG. 2 shows a structure of a decoding side of the frame synchronizing system. Referring to FIG. 1, original digital data Dori produced from a data generator 1 is supplied to an $M^2$ encoder 2. At the $M^2$ encoder 2, the original digital data Dori is $M^2$-modulated based on the $M^2$ code rule and resulting in the data D being output to terminal 3a of a switch 3 and to a sync pattern generator 4, respectively. The sync pattern generator 4 detects whether the last bit cell of the data D supplied from the $M^2$ encoder 2 is an "H" level or "L" level then generates the corresponding sync pattern $P_{SY}$. The pattern $P_{SY}$ is input to the terminal 3b of the switch 3. All of the above-mentioned circuits, the data generator 1, the $M^2$ encoder 2 and the sync pattern generator 4, operate in response to the outputs of AND gates 5 and 6 which both receive a clock signal $S_{2CK}$ and a sync signal $S_{SY}$. The signal $S_{SY}$ becomes "H" in a period 8T where T is a length of bit cells of a signal before encoding and an inverse number of the data rate. During such period, a sync pattern is inserted in the signal $S_{SY}$. It is to be noted that the clock signal $S_{2CK}$ is the one obtained by frequency doubling a clock signal of the bit cell frequency.

In the above-stated structure of FIG. 1, when the sync signal $S_{SY}$ takes an "H" level, the sync signal $S_{SY}$ input to the AND gate 5 is inverted to take an "L" level. As a result, the clock signal $S_{2CK}$ is not output from the AND gate 5 preventing the data generator 1 and the $M^2$ encoder from operating. At this time, since the sync signal $S_{SY}$ input to the AND gate 6 assumes an "H" level, the clock signal $S_{2CK}$ is produced from the AND gate 6 so as to operate the sync pattern generator 4. The sync pattern $P_{SY}$ generated at this time corresponds to the "H" level or "L" level of the last one of the data supplied by the $M_2$ encoder 2. The sync pattern $P_{SY}$ produced by the sync pattern generator 4 input to the terminal 3b. At the switch 3, when the sync signal $S_{SY}$ takes an "H" level, the terminal 3b is connected to the terminal 3c to provide an output at terminal 7.

When the above-described sync signal $S_{SY}$ has an "L" level, the sync signal $S_{SY}$ given to the AND gate 5 is inverted to provide an "H" level. As a result, the clock signal $S_{2CK}$ is output from the AND gate 5 to operate the data generator 1 and the $M^2$ encoder 2. At this time, since the sync signal $S_{SY}$ input to the AND gate 6 takes an "L" level, the clock signal $S_{2CK}$ is not produced from the AND gate 6 preventing the sync pattern generator 4 from operating. The data D produced from the $M^2$ encoder 2 and modulated with the $M^2$ code is input to terminal 3a of switch 3. Also, when the sync signal $S_{SY}$ assumes the "L", level terminal 3a is connected to terminal 3c so as to pass the data D from the $M^2$ encoder 2 to the output terminal 7.

One byte of the above-mentioned sync signal $S_{SY}$ is output for example, for every 35 bytes of the data D. The 35-byte data and one-byte sync pattern $P_{SY}$ form one frame of data.

Referring to FIG. 2, the structure for the decoding side, reception data organized in frames (composed of the sync pattern $P_{SY}$ and data D) is input at terminal 10 and routed to a 16-bit shift register 11 and a PLL circuit 12. The PLL circuit 12 performs an extraction of a bit clock and supplies a two-multiplied clock signal $S_{2CK}$ to the above-mentioned shift register 11 and to an AND gate 13. The shift register 11 is composed of a 16-bit shift register for taking in the above-stated reception data on the basis of the clock signal $S_{2CK}$ supplied from the PLL circuit 12. When the reception data is being transferred in the shift register 11 according to the clock signal $S_{2CK}$, the reception data is supplied to a coincidence detection circuit 14 for every bit of the data.

The reception data from the shift register 11 is output to an $M^2$ decoder 15 and demodulated into the original digital data Dori on the basis of the rule of the $M^2$ code.

At the coincidence detection circuit 14, the reception data taken into the shift register 11 is compared with a predetermined sync pattern $P_{SY}$. If the sync pattern $P_{SY}$ is detected in the reception data, a control signal Scon of "H" level is given output to the AND gate 13 and an output terminal 16. The control signal Scon received at the AND gate 13 is inverted to take an "L" level preventing the clock signal $S_{2CK}$ from being produced and thus preventing the $M^2$ decoder 15 operating. Since this state is continued until the last bit of the sync pattern $P_{SY}$ [8T] has been shifted through the shift register 11, the sync pattern $P_{SY}$ is not processed at the $M^2$ decoder 15.

After the last bit of the sync pattern $P_{SY}$ has passed the shift register 11, the control signal Scon output from the coincidence detection circuit 14 takes an "L" level and is supplied to the AND gate 13 and the output terminal 16. At this time, because the control signal Scon received by the AND gate 13 is inverted to have an "H" level, the clock signal $S_{2CK}$ output from the PLL circuit 12 is passed through the AND gate 13 to operate the $M^2$ decoder 15. In this way, by eliminating the sync pattern $P_{SY}$ and connecting data blocks, which lie before and after the pattern, a data stream satisfying the $M^2$ code rule is obtained. Only data D of the reception data is decoder at the $M^2$ encoder 15, where it is decoded into the original digital data Dori in a synchronized state.

Figure 3A:
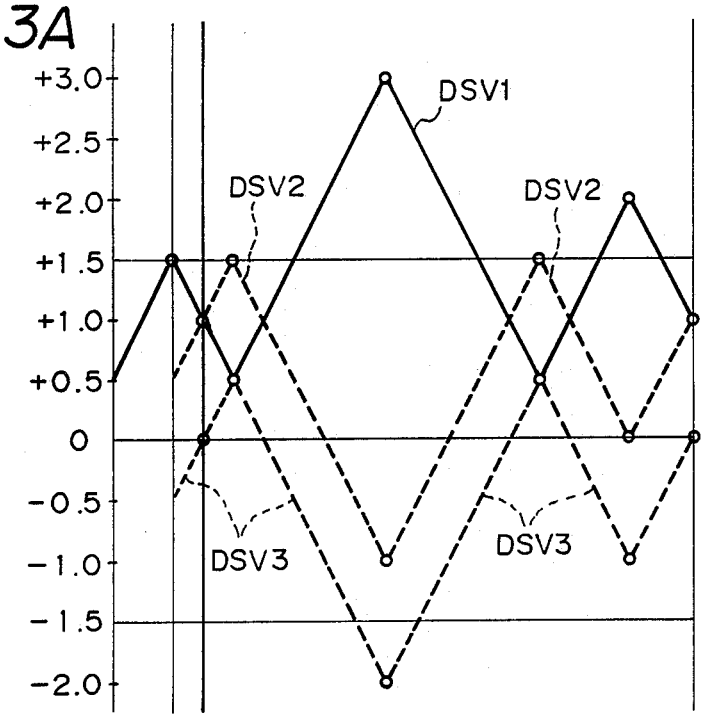
FIGS. 3A, 3B and 4 are time charts for describing the operation of the embodiment of FIG. 1.
Figure 3B:
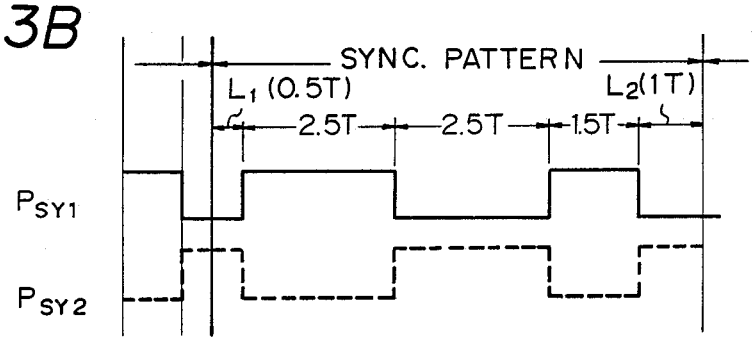
Figure 4:
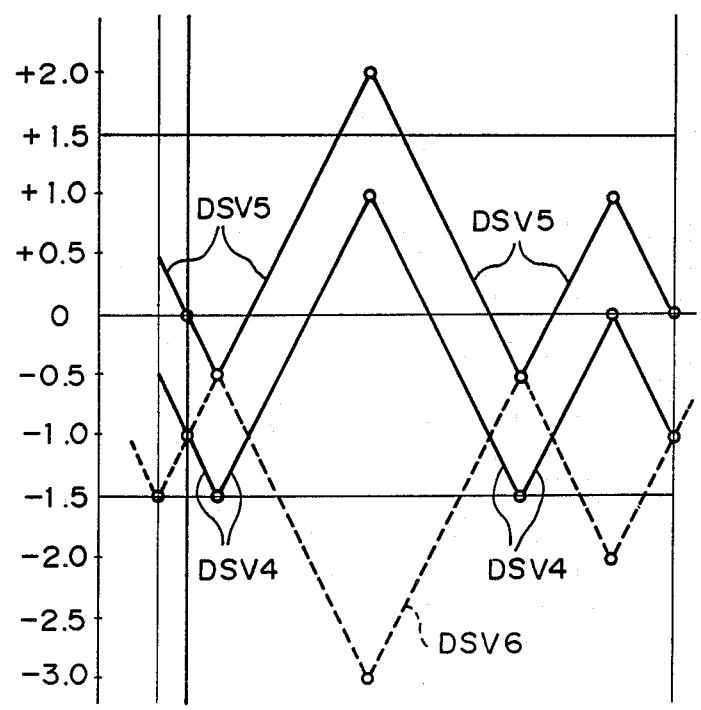
Figure 5:
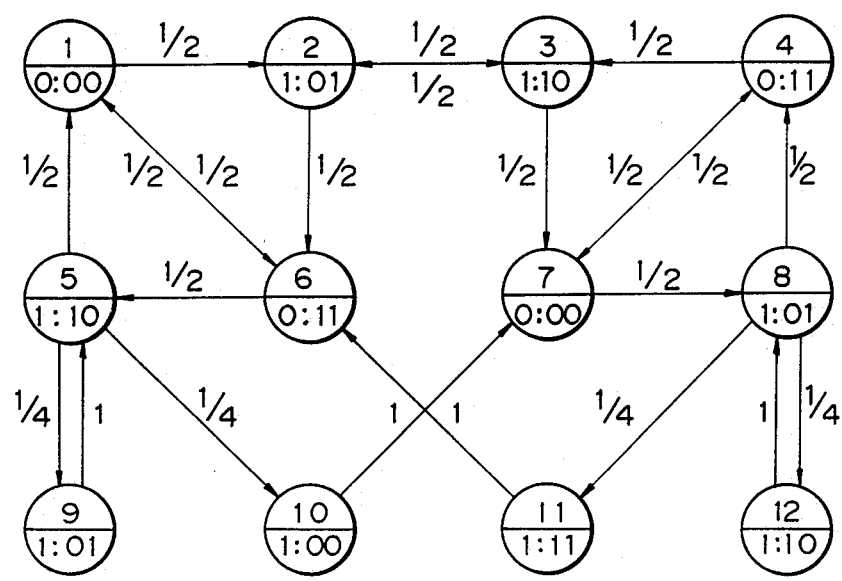
FIG. 5 is a diagram of a state transition of the M² code.

FIG. 3 and FIG. 4 show a state where a unique sync pattern $P_{SY}$ is inserted in the data stream in the $M^2$ code. FIG. 5 shows of a diagram of a state transition of the $M^2$ code. Referring to the transition diagram of FIG. 5, 0:00 shows the bit state of the original digital data and that of the $M^2$ code, respectively. Numerals marked on each arrow indicate the occurrence rate.

In this embodiment, the unique sync pattern $P_{SY}$ in the $M^2$ code means a pattern, which is never formed by the modulation rule of the $M^2$ code. For example, as evident from the state transition diagram of FIG. 5, any of the transition interval 2T, 2.5T or 3T is not continued next to 2.5T in the $M^2$ code and there exists no pattern having a transition interval equal to or larger than 3T [for example, 3.5T]. In sum, if any of 2T, 2.5T or 3T (further 3.5T) or plural ones after 2.5T is selected and their continuity is kept to form a sync pattern $P_{SY}$, this pattern never coincides with the data D modulated with the $M^2$ code except the case where an error has occurred so as to become a unique sync pattern $P_{SY}$. Namely, "a data pattern which does not exist in a data stream encoded into the $M^2$ code in the period of a unique sync pattern" means "a pattern in which a signal transition interval of any of 2T, 2.5T, 3T is continued next to 2.5T or a pattern having a signal transition interval equal to or larger than 3.5T".

Hereunder, one example of the sync pattern $P_{SY}$ will be described referring to FIGS. 3 and 4. FIG. 3A and FIG. 4 show six kinds of changes of DSV (digital sum variation) for two kinds of sync patterns $P_{SY1}$ and $P_{SY2}$. FIG. 3B shows the waveforms of these sync patterns $P_{SY1}$ and $P_{SY2}$.

The sync pattern $P_{SY}$ in this embodiment has eight-bit cells and is formed by the succession of transition intervals 2.5T, which is never formed from the modulation rule of the M² code.

The DSV of the M² code lies between ±1.5., at the bit cell boundary value of the DSV is any one of 0, ±1. In order to (1) cut the data stream at the boundary of arbitrary bit cells, (2) insert a sync pattern $P_{SY}$ and (3) put the DSV at the places other than the sync pattern $P_{SY}$ between ±1.5, the sync pattern $P_{SY}$ must have the same value and the same inclination in a change as the above-mentioned DSV in its first period L1 and its last period L2 ("L" level or "H" level period).

For this reason, the period L1 of the beginning of the unique sync pattern $P_{SY1}$ shown at the solid line in FIG. 3B is 0.5T, and its level is brought to an "L" level equal to the data level immediately before the unique sync pattern. In addition, the period L2 of the last of the unique sync pattern $P_{SY1}$ is 1T, and its level is brought to the "L" level equal to the data level immediately before the sync pattern $P_{SY1}$. The change of the DSV corresponding to this is shown at DSV1 indicated by a solid line in FIG. 3A. In the sync pattern $P_{SY2}$ indicated by a broken line in FIG. 3B, its first period is 0.5T and its data level has an "H" level equal to the data level immediately before the unique sync pattern. Meanwhile, the last period of the pattern $P_{SY2}$ is 1T and its data level is brought to the "H" level ($P_{SY2} = \overline{P_{SY1}}$ is established). The variations of the DSV corresponding to this are shown by DSV2 as indicated by the broken lines in FIG. 3A. These DSV2 and DSV3 correspond to when the value of DSV at the beginning of a sync pattern is +1 or 0, respectively.

FIG. 4 also shows variations of the DSV when the sync patterns $P_{SY1}$ and $P_{SY2}$ are inserted. DSV4 and DSV5 correspond to the changes of the DSV when the sync pattern $P_{SY1}$ is inserted. DSV4 corresponds to when the DSV immediately before the sync pattern $P_{SY1}$ is −1 and DSV5 corresponds to when the DSV immediately before the sync pattern $P_{SY2}$ is 0. DSV6 represents a change of DSV when the sync pattern $P_{SY2}$ is inserted and corresponds to when DSV immediately prior to the sync pattern $P_{SY2}$ is −1.

By this, even if the data stream is cut at the boundary of its arbitrary bit cells and the sync pattern $P_{SY}$ is inserted, it is possible to secure the shortest inversion interval 1T and reduce the longest inversion interval as much as possible (3.5T in this example).

In order to (1) cut the data stream at its arbitrary bit cells and (2) insert the sync pattern $P_{SY}$ or eliminate the sync pattern $P_{SY}$ and (3) connect the data blocks lying before and after the pattern so that the original data stream may be developed, the integration value of the DSV of the sync pattern $P_{SY}$ must be zero and the continuity of the high and low levels of each period of the above-mentioned beginning and last periods of the sync pattern must be kept.

As has been described, in order to bring the integration value of the sync pattern $P_{SY}$ to zero, the total length of the level "L" periods and that of the level "H" periods, which lie within the period [8T] of the unique sync pattern $P_{SY}$, must be one half of the entire length of said unique sync pattern and must be equal to each other. Consequently, the period of each level of "L" and "H" is 4T as shown in FIGS. 3 and 4, respectively.

To keep the continuity of the high and low levels in each of the periods L1 and L2 of the beginning and the last, the number of signal transitions in the period [8T] of the unique sync pattern $P_{SY}$ must be even. As a result, the number of the signal transitions is made even (four times) in both FIG. 3 and FIG. 4.

It is to be noted that the value of the DSV may exceed ±1.5 in the period of the sync pattern $P_{SY}$ is unique.

Meantime, the value of the DSV at the boundary of the bit cells is any of 0, ±1 as mentioned before. As a result, the value and inclination of data immediately before the sync pattern $P_{SY}$ at the above-mentioned three points (DSV of 0, ±1) have either an increase tendency or a decrease tendency in terms of the time-axis direction. For the three points and two tendencies there are six (3×2=6) ways as a whole. For this reason, in FIG. 3A, the state where a unique sync pattern is inserted is indicated three ways including both of the increase and decrease directions (DSV2, DSV1) at the point of DSV = +1 and the increase direction (DSV3) at the point of DSV=0. In FIG. 4, the three ways indicating the state include both of the increase and decrease directions (DSV6, DSV4) at the point of DSV= −1 and the decrease direction (DSV5) at the point of DSV=0. The DSV changes DSV1 to DSV3 shown in FIG. 3A and the DSV changes DSV4 to DSV6 shown in FIG. 4 are symmetrical with respect to the boundaries defined by the lines of DSV=0.

Next, the significance of the unique sync pattern $P_{SY}$ will be described. For an example, the sync patterns $P_{SY}$ indicated in FIGS. 3 and 4 are compared with a 16-bit sync pattern, which is not unique.

First, the probability of a 16-bit sync pattern which is not unique appearing in a data stream is $2^{-16} \simeq 1.5 \times 10^{-5}$ on the assumption that there is no error. Meanwhile, in the case of an 8-bit unique sync pattern, the probability that it appears in the data stream is zero if it is assumed that no error exits. Therefore, an error must be considered. Now, it is assumed that the bit error rate after the decoding of the M² code is A 18, $10^{-3}$ (this corresponds to he byte error rate $8 \times 10^{-3}$ the probability of the erroneous detection of data as a sync pattern $P_{SY}$ becomes $\simeq 8 \times 10^{-6}$. Assuming that bit error rate is $10^{-4}$, this probability becomes $\simeq 8 \times 10^{-7}$. In this way, the 8-bit unique sync pattern $P_{SY}$ has the capability equal to or greater than that of the 16-bit sync pattern which is not unique. Also, the longest inversion interval is 3.5T as compared with 3T of the usual M² code (DSV may be ±3 at a maximum in the period of the sync pattern).

According to this embodiment, there is an advantage that erroneous detection as a sync pattern of data in the data stream modulated with the M² code can be prevented to avoid the synchronization shift and the occurrence of erroneous synchronization. As a result, the frame synchronization can be established correctly and stably to perform digital data reproduction. Further, by eliminating the sync pattern and connecting the data blocks lying after and before as they are, a data stream satisfying the M² code rule can be obtained.

Also, according to this invention, even if the data stream is cut at the boundary of its arbitrary bit cells and a sync pattern is inserted, the shortest inversion interval 1T can be secured and simultaneously the longest inversion interval can be shortened as much as possible (3.5T in the embodiment).

Further, with respect to the probability that data is erroneously detected as a sync pattern, an 8-bit unique sync pattern the probability is far lower than for a 16-bit sync pattern which is not unique. For this reason, the 8-bit unique sync pattern can expect the capability equal to or greater than the 16-bit sync pattern which is not unique. As a consequence, the prevention of an increased redundancy for frame synchronization can be achieved.

Next, a second embodiment of the invention will be described referring to the drawings. As shown in FIGS. 6 to 13, in the second embodiment, the invention is applied to a sync pattern of eight-bit cells (8T) similarly to that for the first embodiment.

Referring to FIGS. 6–11, a second embodiment is illustrated in which a is inserted in original data and converted into the $M^2$ code.

Figure 6:
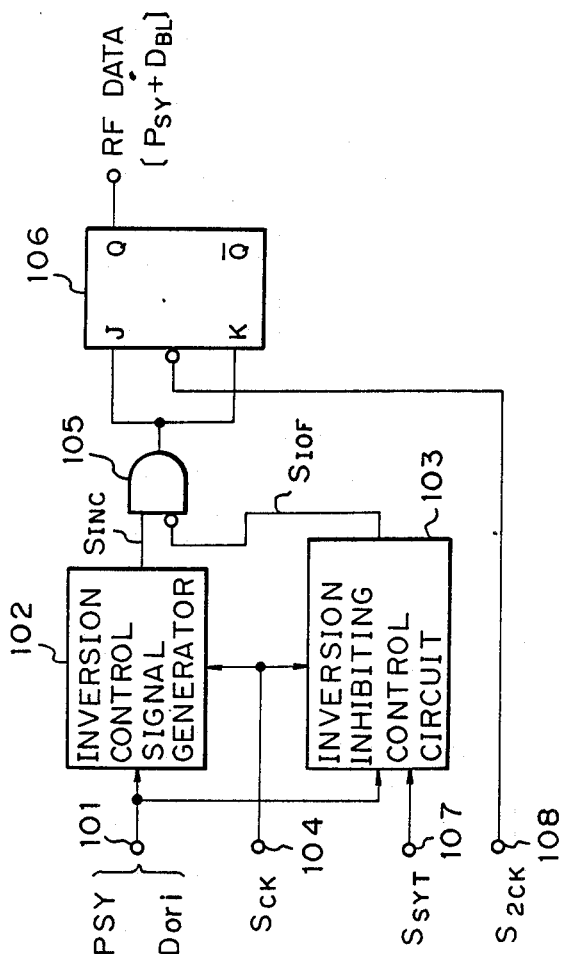
FIG. 6 is a block diagram of a decoder for decoding encoded data for the embodiment of FIG.1.
Figure 7:
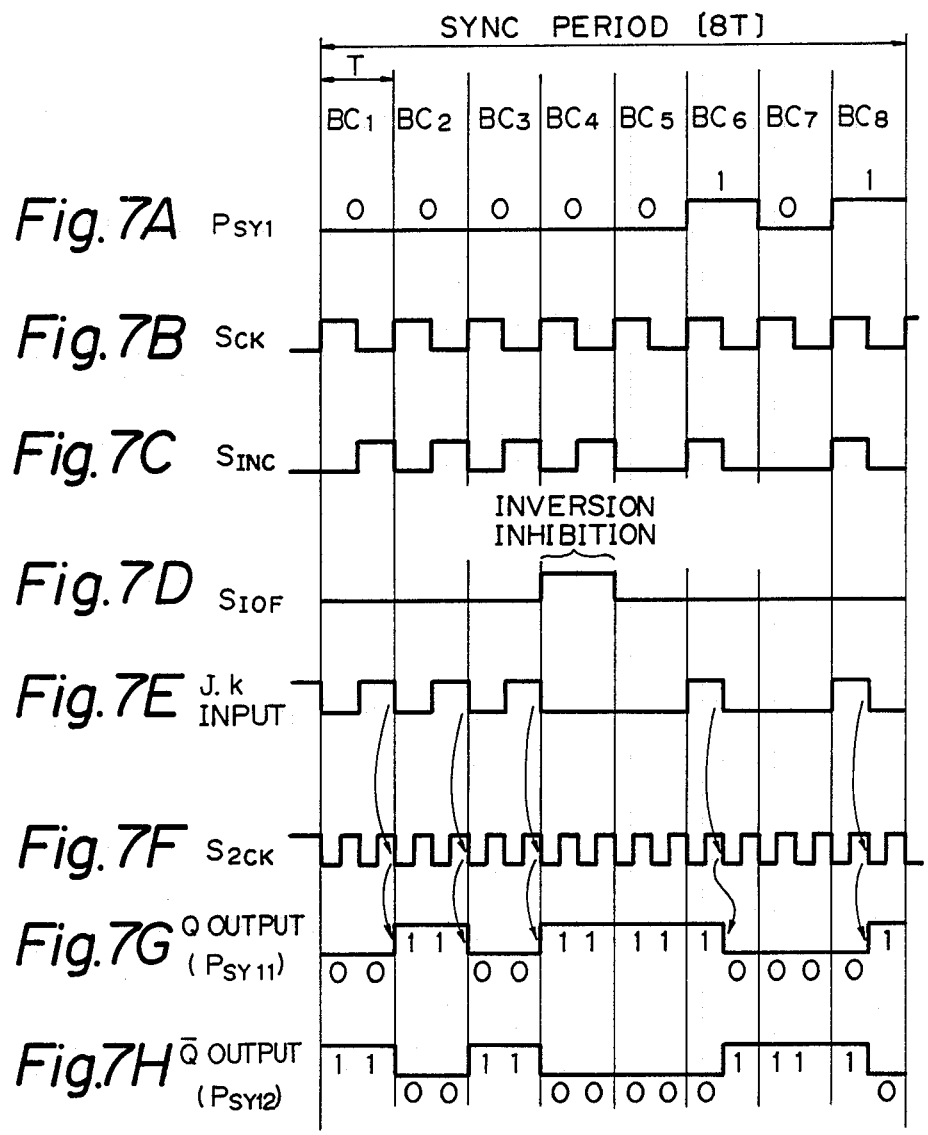
FIGS. 7A-7H and 8A-8H are time charts for describing the embodiment of FIG. 6.
Figure 8:
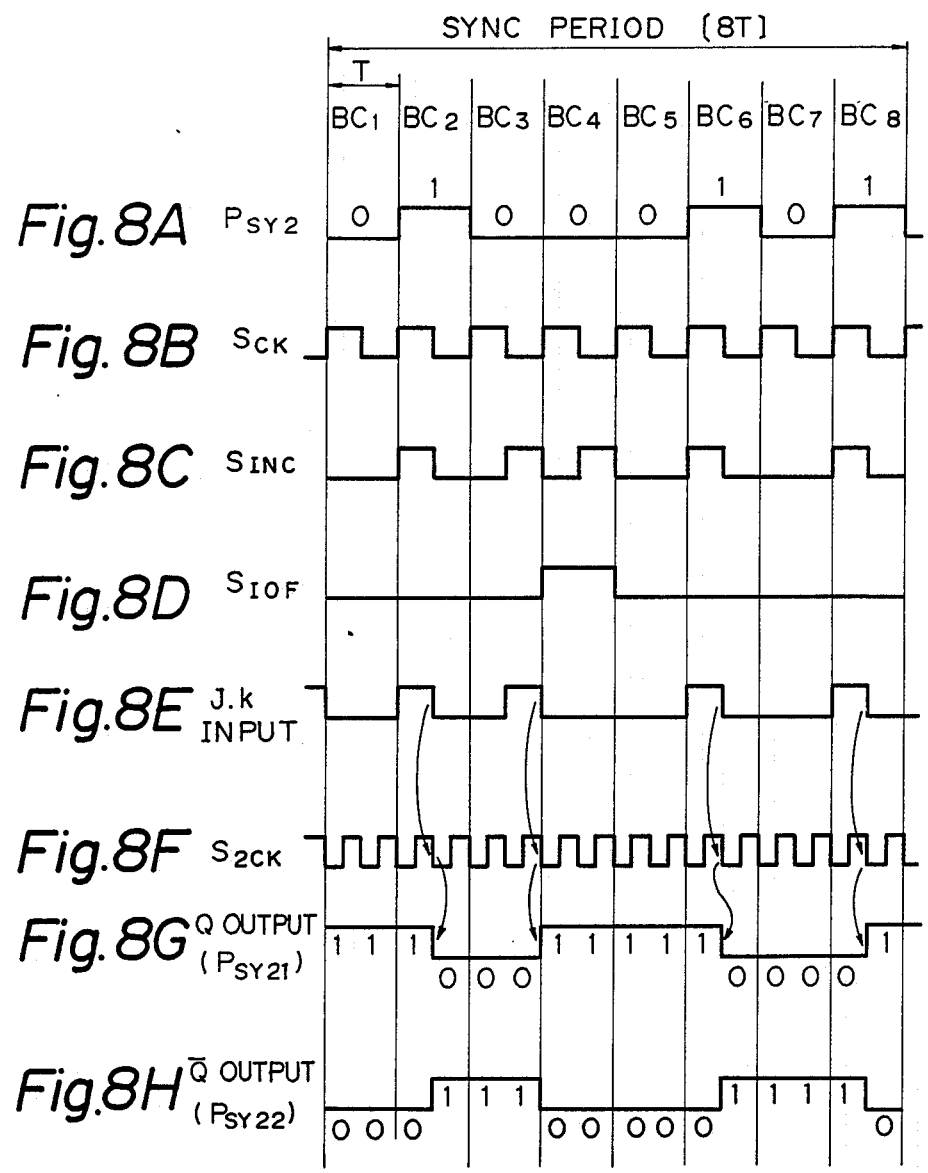

FIGS. 6 to 8 show a structure for the encoding side of the frame synchronizing Referring to FIG. 6, a terminal 101 receives a sync pattern $P_{SY}$ of eight bit blocks 8T or original digital data Dori as a signal generator passing the signal to an inversion control signal generator 102 for $M^2$ (hereunder called "control signal generator") and an inversion inhibiting control circuit 103. The circuits 102 and 103 operate in synchronism with a clock signal $S_{CK}$, which is received via terminal 104 and has the bit cell frequency.

At the control signal generator 102, an inversion control signal SINC is developed by the sync pattern $P_{SY}$ or the original digital data Dori based on the $M^2$ code modulation rule. The signal SINC is supplied to an AND gate 105.

The inversion inhibiting control circuit 103 produces an inversion inhibiting signal $S_{IOF}$ having an "H" the signal is supplied to the AND gate 105 when predetermined inversion inhibiting portions of the sync pattern $P_{SY}$, sequentially received using the clock signal $S_{CK}$ are detected while a sync period signal $S_{SYT}$ indicative of a sync insertion period is input from a terminal 107. The inversion inhibiting signal $S_{IOF}$ is output to have an "L" level in periods other than the predetermined inversion inhibiting portions of said sync insertion period.

At the AND gate 105, the inversion inhibiting signal $S_{IOF}$ input line is inverted by an inverter when the signal SIOR has an "L" level. As a result, an inversion control signal SINC produced by the inversion control signal generator 102 is given to both of the J and K terminals of a J-K flip-flop 106 (called "J-L FF" hereunder). RF data is produced from the Q terminal of the flip-flop 106 in response to the trailing edge of a clock signal $S_{2CK}$ received via a terminal 108 for the appropriate input state of the J and K terminals. The clock signal $S_{2CK}$ is obtained by frequency doubling the clock signal $S_{CK}$ with the bit cell frequency.

Also, in the case where the above-stated inversion inhibiting signal $S_{IOF}$ assumes an "H" level, it is inverted on the input side of the AND gate 105 to have an "L" level. As a result, the output of the AND gate 105 is brought to the "L" level to be given to the J and K terminals. The J-K FF 106 consequently holds the previous RF data and outputs it.

Referring to FIGS. 6 to 8, the circuit operation on the encoding side will be described.

While the original data Dori is received at the terminal 101, out output having an "L" level is supplied to the AND gate 105 from the inversion inhibiting control circuit 103 as mentioned before. Since this output is inverted to have an "H" level, the inversion control signal SINC from the control signal generator 102 is directly supplied to the J and K terminals of the J-K FF 106. In response to the input state of the J and K terminals, the RF data is sequentially output in synchronism with the trailing edge of the clock signal $S_{2CK}$.

In a sync insertion period in which a sync pattern $P_{SY}$ is inserted, sync patterns $P_{SY1}$ ("00000101") and $P_{SY2}$ ("01000101") represented by NRZ (non-return-to-zero) are supplied to the control signal generator 102. The generator 102 selects either of the two patterns depending on the state of the original digital data Dori.

Further, the sync period signal $S_{SYT}$ is given to the inversion inhibiting control circuit 103. As shown in FIG. 7A, assuming that the sync pattern $P_{SY1}$ "00000101" indicated by NRZ is selected, the inversion control signal $S_{INC}$ is developed by the control signal generator 102. As shown in FIG. 7C, the inversion control signal $S_{INC}$ rises by $\frac{1}{2}$ T in the latter part of the bit cell in synchronism with the clock signal $S_{CK}$ when data is "0", while it rises by $\frac{1}{2}$ T in the early part of the bit cell when data is "1". Here, T is the bit cell length of a signal prior to encoding and is an inverse number of the data rate.

In the case of this sync pattern $P_{SY1}$, only the interval between fourth and fifth bit cells is regarded as an inversion inhibiting portion as mentioned later.

Accordingly, no inversion inhibiting portions exist in the intervals between bit cells other than said fourth and fifth bit cells as indicated in FIGS. 7C and 7E, and the inversion control signal $S_{INC}$ is directly supplied to the J-K FF 106.

When a bit cell having an inversion inhibiting portion, i.e., the fourth bit cell BC4 of the sync pattern $P_{SY1}$ is detected at the inversion inhibiting control circuit 103, the inversion inhibiting signal $S_{IOF}$ with an "H" level is produced from the inversion inhibiting control circuit 103 to the AND gate 105 as shown in FIG. 7D. An output having an "L" level from the AND gate 105 is consequently given to the J-K FF 106 during a period of the bit cell BC4 as indicated in FIG. 7E.

The $M^2$ encoding process of the above-mentioned sync pattern $P_{SY1}$ represented by NRZ will be described hereunder.

(1) In a first bit cell BC1 ("0") of the sync pattern ("00000101"), assuming that an original Q output is zero, the Q output of the J-K FF 106 becomes "00" as shown in FIG. 7G since the conditions for varying the Q output are not met. In a $\frac{1}{2}$T period of the latter part of the bit cell BC1, the inversion control signal $S_{INC}$ assumes an "H" level as shown in FIG. 7C so that the signal $S_{INC}$ is directly output to both of the J and K terminals of the J-K FF 106.

(2) As shown in FIGS. 7C and 7E in a second bit cell BC2 ("0"), the J and K terminals of the J-K FF 106 have an "H" level. For this reason, the Q output of the J-K FF 106 is inverted with the trailing edge of the clock signal $S_{2CK}$ to provide "11".

(3) In a third bit cell BC3 ("0"), the Q output of the J-K FF 106 is inverted at the rising edge to provide "00" in a manner similar to the above (2).

(4) As shown in FIGS. 7D and 7E, in the fourth bit cell BC4 ("0"), the inversion inhibiting signal $S_{IOF}$ rises but the J-K terminals of the J-K FF 106 still have an "H" level. As a result, the Q output of the J-K FF 106 is inverted to provide "11" with the falling of the clock signal $S_{2CK}$.

(5) In the fifth bit cell BC5 ("0"), an "L" level is given to the J-K FF 106 by the inversion inhibiting signal $S_{IOF}$ with the "H" level. The Q output consequently has the output of the above (4) to provide "11".

(6) In a sixth bit cell BC6 ("1"), the signal $S_{INC}$ has an "H" level in a $\frac{1}{2}$T period in the early part of the bit cell BC6. The "H" level is given to the J-K FF 106. In this case, the input of the J-K FF 106 has an "H" level, and the position where the clock signal $S_{2CK}$ falls lies in the middle of the bit cell BC6. As a result, the Q output of the J-K FF 106 is inverted in the middle of the bit cell BC6. In other words, in the early part of the bit cell BC6, the previous output "1" is held, while "0" is produced in the latter part of the same cell. As a result, the Q output becomes "10".

(7) As shown in FIG. 7C, in a seventh bit cell BC7 ("0"), because the inversion control signal $S_{INC}$ remains in the "L" level, the input of the J-K FF 106 assumes an "L" level, so that the Q output is brought to "00" to keep the state of the above (6).

(8) In an eighth bit cell BC8 ("1"), the Q output is inverted in the middle of the bit cell BC8 in a similar manner to the above (6). Specifically, "0" of the output of the above (7) is retained in the early part, while in the latter part, "1" is produced after the inversion. The sync pattern $P_{SY1}$ "00000101" represented by NRZ becomes "0011001111100001" through the process of the above (1) to (8), and a sync pattern $P_{SY11}$, which has been $M^2$-coded with 16 bits, is developed depending on the rate of the clock signal $S_{2CK}$.

A $\overline{Q}$ output shown in FIG. 7F is a pattern when the original Q output of the J-K FF 106 is "1", and is a sync pattern $P_{SY12}$ with "0" and "1" inverted for the above-mentioned sync pattern $P_{SY11}$. FIG. 8 shows a time chart similar to FIG. 7 when "01000101" represented by NRZ is adopted as a sync pattern $P_{SY}$ although a detailed description is not given. Similarly sync patterns $P_{SY21}$ which are and $P_{SY22}$ $M^2$-coded with 16 bits at the rate of the clock signal $S_{2CK}$ are developed in a manner similar to the above-mentioned sync patterns $P_{SY11}$ and $P_{SY12}$. The sync pattern $P_{SY21}$ in this case is ("1110001111100001"). In and the sync pattern $P_{SY22}$ is ("0000111000001110").

Figure 9:
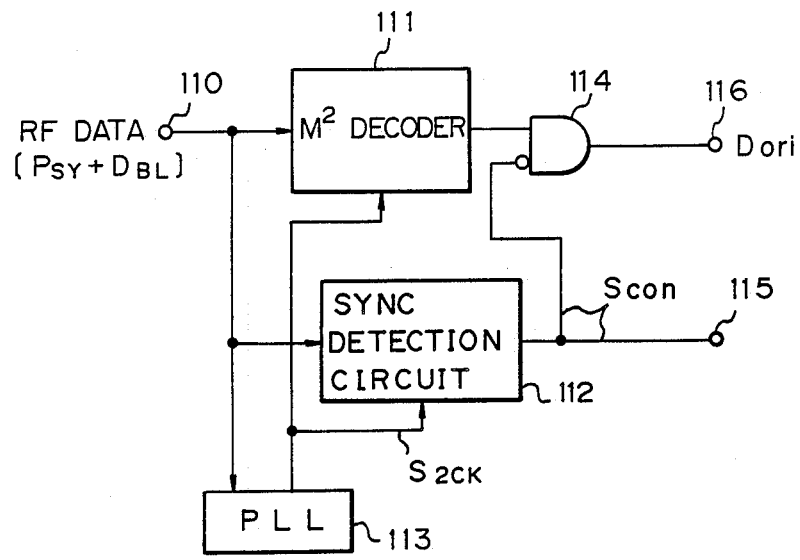
FIG. 9 is a block diagram of a decoder for decoding data encoded in the embodiment of FIG. 6.
Figure 10:
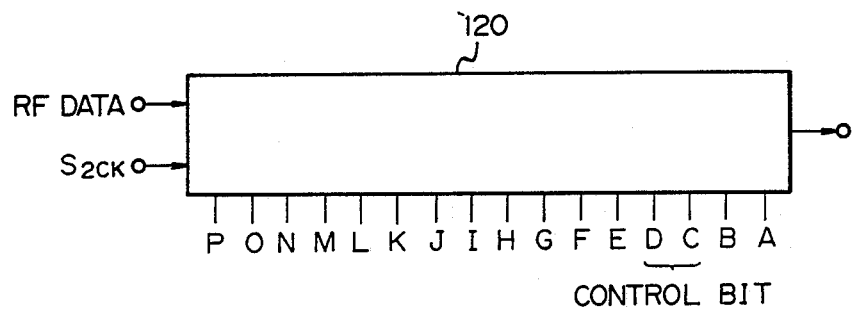
FIGS. 10 and 11 are block diagrams for showing detailed examples of a sync detection circuit.
Figure 11:
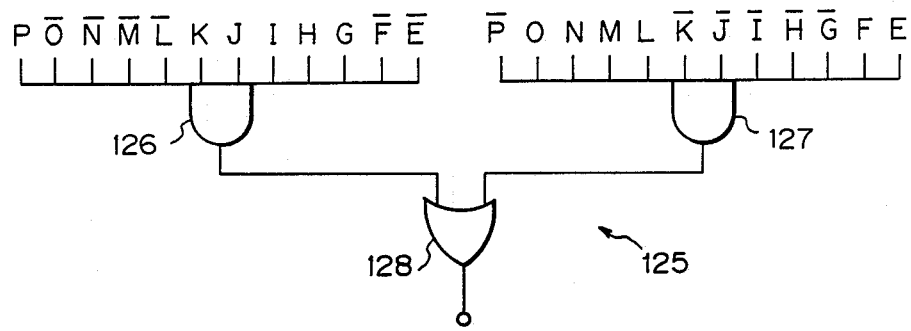

FIGS. 9 to 11 show a structure of the decoding side of a frame synchronizing system.

RF data having frame structure (frame data composed of a sync pattern $P_{SY}$ and a data block $D_{BL}$) is received via terminal 110 and output to an $M^2$ decoder 111, a sync detection circuit 112 and a PLL circuit 113, respectively.

The PLL circuit 113 extracts a bit clock from the RF data and supplies a frequency doubled clock signal $S_{2CK}$ to the $M^2$ decoder 111 and the sync detection circuit 112.

The $M^2$ decoder 11 decodes the RF data supplied from the terminal 110 into original digital data Dori on using the $M^2$ code rule and outputs the decoded data to an AND gate 114.

In the sync detection circuit 112, the RF data given from the terminal 110 and a predetermined sync pattern $P_{SY}$ are compared. If the sync pattern $P_{SY}$ is detected in the RF data, a control signal Scon taking a "H" level is supplied to the AND gate 114 and an output terminal 115. The control signal Scon input to the AND gate 114 assumes an "L" level after being inverted. As a result, the original digital data Dori is not output from the AND gate 114. This state is continued during a sync period of 8T.

After the last bit of the sync pattern $P_{SY}$ has passed the sync detection circuit 112, the control signal produced from the circuit 112 takes an "L" level and is fed to the AND gate 114 and the output terminal 115. At this time, the control signal Scon given to the AND gate 114 is inverted to have an "H" level. The original, digital data Dori decoded at the $M^2$ decoder 111 now is supplied to the output terminal 116.

The $M^2$ decoder 111 and the sync detection circuit 112 operate in synchronism with the clock signal $S_{2CK}$ given from the PLL circuit 113.

In this way, the sync pattern $P_{SY}$ is detected in the sync period (8T). periods other than the sync period, only the data block DBL of the RF data is decoded at the $M^2$ decoder 111 and reproduced into the original digital data Dori.

FIGS. 10 and 11 show examples of the sync detection circuit 112. A sync detection circuit 120 of FIG. 10 is a shift register. The shift register 120 is composed of 16 bits and receives the RF data in response to the clock signal $S_{2CK}$ fed from the PLL circuit 113 (each signal of the 16 bits is represented by each code of A to P). When the RF data, is moving in the shift register 120 in accordance with the clock signal $S_{2CK}$, the RF data is compared with a sixteen-bit sync pattern $P_{SY}$ predetermined for each of the 16 bits. The control signal Scon having an "H" level is output from the sync detection circuit 120. Codes C and D of the codes A to P corresponding to the 16 bits are control bits.

In a sync detection circuit 125 of FIG. 11, an AND operation at AND gates 126 and 127 is performed for two common sync patterns of the above-mentioned four sync patterns $P_{SY11}$, $P_{SY12}$, $P_{SY21}$ and $P_{SY22}$. The AND operation is performed on 12 bits E to P bits (that is, with respect to the $P_{SY11}$ and $P_{SY21}$; the $P_{SY12}$ and $P_{SY22}$). The outputs of the AND gates 126 and 127 are given to an OR gate 128 to detect a sync pattern $P_{SY}$.

Figure 12:
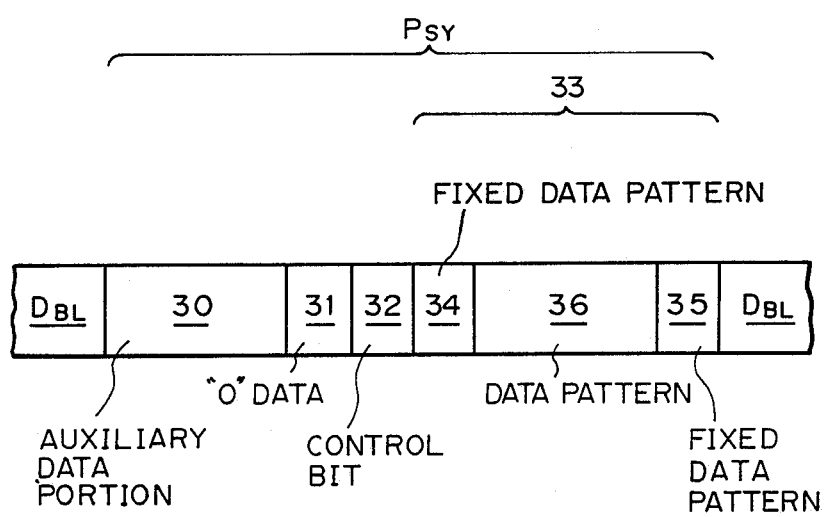
FIG. 12 is a diagram for showing a data pattern.

All the four kinds of sync patterns $P_{SY11}$ to $P_{SY22}$ may be combined at the OR gate 128 though not shown. Namely, Logical equation $Y = \overline{AB}CD\overline{EFGHIJKLMN}\overline{OP} +$ $AB\overline{C}DEFGHIJKL\overline{MN}\overline{OP} + \overline{ABC}DEFGHIJKLMN\overline{OP} +$ $\overline{AB}CDEFGHIJKLMN\overline{OP}$ Referring to FIGS. 12 to 13, an example of a unique sync pattern (sync data pattern) will be described. FIG. 12 shows an entire structure of the sync pattern. FIGS. 13A and 13D indicate changes of the DSV (digital sum variation) of the sync patterns $P_{SY11}$ to $P_{SY22}$ FIGS. 13B and 13C and show waveforms of the sync patterns $P_{SY11}$ and $P_{SY22}$, respectively.

The sync pattern $P_{SY}$ shown in FIG. 12 is composed of an auxiliary data portion 30, "0" data 31 of one bit with a "0" inserted, a control bit 32 with a "0" or "1" inserted and a five-bit sync data pattern 33, and has an eight-bit cell length (8T) except for the data portion 30. The sync data pattern 33 is made up of fixed patterns 34, 35 and a unique data pattern 36 disposed between the fixed patterns 34 and 35.

The "0" data 31 and the control bit 32 function to complete the starting point of the sync pattern with any one of the following three patterns based on the $M^2$ code:

A pattern 1, 11, 111, 1111, 111 . . . 1

B pattern 00, 010, 01110, 0 111 . . . 0

2n-1

-continued

C pattern 0110, 011110, 0111 ... 10
$\underbrace{\phantom{0111...10}}_{2n}$

The "0" data 31 and the control bit 32 are also used to bring the DSV at the starting point of the sync pattern to zero. This is to generate the shortest sync pattern $P_{SY}$ (sync pattern 33) among the sync patterns $P_{SY}$'s having the same unique pattern. Namely, it is known that the DSV of the $M^2$ code lies between $\pm 1.5$ and the value of DSV is either 0 or $\pm 1$ at the boundaries of the bit cells.

Therefore, in a last point 37 of the data block $D_{BL}$ indicated in FIGS. 13A and 13D, the DSV takes either $\pm 1$ or 0 providing six kinds of variations i.e., each a the three, values has two directions of decrease and increase direction).

Consequently, by providing the "0" data 31 subsequent to the data block DBL, the lines of the DSV at both points of $\pm 1$ on the side of the starting point of the bit cell BC1 of the "0" data 31, i.e., the last point 37 of the data block $D_{BL}$ are reversed For this reason, there are four kinds of variations of the DSV at the bit cell BC1 of the "0" data 31. Namely, DSV=1 indicates only the decrease direction ($P_{SY22}$), DSV=0 indicates both the direction increase and decrease ($P_{SY11}$, $P_{SY21}$), and DSV=$-1$ indicates only the increase direction ($P_{SY21}$). The value of the DSV at the, last point 38 of the "0" data bit cell BC1 takes any one value of $\pm 1$, and 0. Variations of the DSV at the last point 38 of the cell BC1 are consequently completed to have any one of the above-mentioned three patterns.

In the bit cell BC2 of the control bit, "1" or "0" data is inserted whose polarity is inversion-controlled depending on the DSV at the last point 38 of the bit cell BC1 of the "0" data. As a result, the DSV at a last point 39 of the bit cell BC2 becomes 0 (that is, "0" for DSV=$\pm 1$, "1" for DSV=0).

As a result, the shortest sync pattern $P_{SY}$ can be generated among the sync patterns $P_{SY}$'s having the same unique pattern, and the DSV of the entire sync patterns $P_{SY}$'s can be put within the range of $\pm 1.5$.

The sync data pattern 33 is provided next to the control bit 32, and the unique data pattern 36 is disposed between the fixed patterns 34 and 35.

It is to be noted that the unique data pattern 36 is a pattern having a signal transition interval, which is never developed from the $M^2$ code modulation rule. For example, as is evident from the state transition of FIG. 5, the signal transition interval of 2T, 2.5T or 3T or their combination does not continue after 2.5T. Further, no pattern with a transition interval exceeding 3T (for instance, 3.5T) exists. In sum, if the data pattern 36 is formed by selecting and continuing any one of 2T, 2.5T or 3T or plural of the same, after 2T, the pattern 36 does not coincide with data modulated with the $M^2$ code except the case where an error has occurred. For this reason, the data pattern 36 becomes unique.

Therefore, the pattern such as the data pattern 36 in which the continued occurrence of the signal transition intervals 2.5T and 2T takes place is a unique pattern. As a result, since the data pattern 36 is a unique pattern never developed from the $M^2$ code modulation rule, the detection of the sync pattern $P_{SY}$ becomes easy and its erroneous detection can be prevented.

The fixed pattern 34 with a "0" inserted is to put the DSV of the sync data pattern 33 within $\pm 1.5$. The sync pattern 35 brings the DSV of the sync pattern 33 to zero and caused the DSV of a subsequent data block $D_{BL}$ to be within $\pm 1.5$. Since at the last end 39 of the bit cell BC2, DSV=0 is established, there is a possibility that the DSV may exceed the range of $\pm 1.5$ in the case where the signal transition interval in the data pattern 36 is 2.5T and where there is no fixed pattern with a zero inserted. Also, if the DSV of the data block $D_{BL}$ is started from zero, there is a case where the DSV of the data block $D_{BL}$ is not put within the range of $\pm 1.5$ and where the condition for making DC free is not satisfied.

It is to be noted that the data pattern 36 may be equal to or greater than 3.5T. The DSV of the sync data pattern 33 in this case may exceed $\pm 1.5$.

To keep a signal transition period of 2.5T, an inversion inhibiting point $P_{IOF}$ is set in the data pattern 36 as shown in FIGS. 13A and 13C. This is achieved by keeping the Q output with an "L" level output to both of the J and K terminals of the J-K FF 106 as mentioned in detail above.

As indicated in FIGS. 13A and 13D, the bits "00" are inserted in both bit cells adjacent to the inversion inhibiting point $P_{IOF}$, i.e., the bit cells BC4 and BC5. In the usual $M^2$ code, the tendency of the DSV reverses at said point $P_{IOF}$. More specifically, what has an increase or decrease tendency at the bit cell BC4 becomes the one having a decrease or increase tendency at the next bit cell BC5. However, by setting of the inversion inhibiting point $P_{IOF}$, the tendency of the DSV becomes continuous at the bit cells BC4 and BC5 to assure the signal transition interval of 2.5T.

The above-mentioned control bit 32, the number of zeros of the digital signal and the, presence or absence of inversion inhibition are shown in the table given below.

| Number of zeros of digital signal | Control bit | Presence or absence of inversion inhibition |
|---|---|---|
| even | 1 | presence |
| odd | 0 | presence |

The position of the inversion inhibiting point varies depending on a preset sync pattern $P_{SY}$.

As has been described above, if data to be inserted into such data as the "0" data 31, the control bit 32 ("0" or "1"), the fixed pattern 34 ("0"), the data pattern 36 (2.5T +2T) and the fixed pattern 36 or various conditions giving limitations are represented by the NRZ format, the following two patterns become the sync pattern:

| |
|---|
| "00000101" (sync pattern $P_{SY1}$) |
| "01000101" (sync pattern $P_{SY2}$) |

By representing these sync patterns $P_{SY1}$ and $P_{SY2}$ with the clock rate of the clock signal $S_{2CK}$, the following four patterns become the sync patterns $P_{SY11}$ to $P_{SY22}$ as mentioned before:

| |
|---|
| 0011001111100001 (sync pattern $P_{SY11}$) |
| 1110001111100001 (sync pattern $P_{SY21}$) |
| 1100110000011110 (sync pattern $P_{SY12}$) |
| 0001110000011110 (sync pattern $P_{SY22}$) |
| ABCDEFGHIJKLMNOP |

These four sync patterns $P_{SY11}$ to $P_{SY22}$ are all 16-bit represented. The sync patterns $P_{SY11}$ and $P_{SY12}$ correspond to the above-mentioned sync pattern $P_{SY1}$, and the sync patterns $P_{SY21}$ and $P_{SY22}$ correspond to the above-mentioned sync pattern $P_{SY2}$.

With a correspondence between the value of each bit and the DSV variations, the sync patterns $P_{SY11}$, $P_{SY12}$, $P_{SY21}$ and $P_{SY22}$ are respectively indicated in FIGS. 13A to 13D. As is clear in FIGS. 13A to 13C, DSV=0 is established at the last point 39 of the control bit 32 in any one of the sync patterns $P_{SY11}$, $P_{SY12}$, $P_{SY21}$ and $P_{SY22}$. The fixed pattern 34 brought to zero can prevent the sync pattern 33 from being outside of the range of ±1.5. The provision of the inversion inhibiting point $P_{IOF}$ in the data pattern 36 enables the transition interval of the data pattern 36 to be maintained at 2.5T. Further, the DSV at a last point 40 of the sync pattern $P_{SY}$ is brought to zero by the fixed pattern 35.

It is to be noted that although all of the "0" data 31, the control bit 32, the fixed pattern 34, etc. have a length of one bit as described, they may have an arbitrary bit length depending on the bit length of a corresponding sync pattern.

According to the second embodiment, the erroneous detection of M²-code modulated data in the data stream as a sync pattern can be prevented. As a result, a synchronization shift and a synchronization error can be prevented so that a correct and stable synchronization is established enabling the a reproduction of a digital signal with high fidelity.

Among the sync patterns having a unique pattern, the shortest sync pattern can be formed without enhancing the redundancy for the frame synchronization.

Additionally, the DSV at the last point of a sync pattern is brought to zero by a fixed pattern subsequent to the sync pattern and data subsequent to the sync pattern starts at the DSV=0. As a result, DSV of a digital signal following the sync pattern can be placed within ±1.5 to assure a DC-free state and to simplify a decoding circuit.

Further, in the second embodiment, since the fixed pattern is disposed before a data pattern, the DSV of the entire sync pattern can be put within ±1.5 so as to maintain the entire sync pattern in the DC-free state.

What is claimed is:

1. A frame synchronizing method for generating encoded data having a frame synchronizing signal inserted in a data stream based on original data having a first logical bit state and a second logical bit state, said method comprising the steps of:
    encoding said original data into a stream of M² coded data;
    generating a frame synchronizing signal in response to said M² coded data so that said frame synchronizing signal has a unique pattern which does not appear in said M² coded data; and
    inserting said frame synchronizing signal into said M² coded data stream.

2. A frame synchronizing method as in claim 1, wherein the original data comprises a plurality of bit cells, and in which said frame synchronizing signal with said unique pattern has an even number of level transitions between a relatively low and a relatively high level, a total period of time in said frame synchronizing signal at said relatively low level is equal to a total period of time in said frame synchronizing signal at said relatively high level so the time at either the relatively low level or the relatively high level is equal to one half of the total period of time of said unique pattern, said frame synchronizing signal having an initial portion with an initial period of time equal to one half a period of each bit cell of the original data, said initial portion during said initial period of time having a level a level of the M² coded data stream preceding said unique pattern, said frame synchronizing signal further having a last portion with a last period of time which is no longer than said period of a bit cell and having a level during the last period of time equal to said level during said initial period of time.

3. A frame synchronizing method as in claim 2, wherein said unique pattern includes a portion with a period of time equal to two and a half times said period of a bit cell and which occurs between two sequential level transitions and a second portion with a period of time equal to two, tow and a half or three items said period of a bit cell and which occurs between a next two sequential level transitions.

4. A frame synchronizing method as in claim 2, wherein said unique pattern includes a portion with a period of time longer than three times said period of a bit cell and which occurs between two sequential level transitions.

5. A frame synchronizing method as in claim 1, wherein said step of generating includes the steps of generating a synchronizing pattern to form said frame synchronizing signal, encoding said synchronizing pattern into encoded data including said unique pattern, and inserting said encoded data into said M² coded data stream.

6. A frame synchronizing method as in claim 5, wherein said synchronizing pattern includes a synchronizing data pattern with a predetermined number of bits, "0" data preceding said synchronizing data pattern, and a control bit arranged between said "0" data and said synchronizing data pattern, said control bit having a level depending on a DSV (digital sum variation) at a starting point of said synchronizing data pattern.

7. A frame synchronizing method as in claim 6, wherein said step of encoding the synchronizing data pattern produces a portion with a period of time equal to two and a half times said period of a bit cell and which occurs between two sequential level transitions followed by a second portion with a period of time equal to two, two and a half or three times said period of a bit cell and which occurs between a next two sequential level transitions.

8. A frame synchronizing method as in claim 6, wherein said frame synchronizing signal has a total period longer than three times said period of a bit cell.

9. A frame synchronizing system for generating encoded data having a frame synchronizing signal inserted in a data stream based on original data having a first logical bit state and a second logical bit state, said system comprising:
    means for encoding said original data into a stream of M² coded data;
    means for generating a frame synchronizing signal in response to said M² coded data so that said frame synchronizing signal has a unique pattern which does not appear in said M² coded data; and
    means for inserting said frame synchronizing signal into said M² coded data stream.

10. A frame synchronizing system as in claim 9, wherein the original data comprises a plurality of bit cells each having a predetermined period, and wherein said frame synchronizing signal with said unique pattern has an even number of level transitions between a relatively low and a relatively high level, in which a total period of time in said frame synchronizing signal at said relatively low level is equal period of time in said frame synchronizing signal at said relatively high level period of time at either the relatively low level or the relatively high level is equal to one half of the total period of time of said unique pattern, said frame synchronizing signal having an initial portion with an initial period of time equal to one half said period of each bit cell of the original data, said initial portion having a during said initial period of time equal to a level of the $M^2$ coded data stream preceding said unique pattern, said frame synchronizing signal further having a last portion with a last period of time which is longer than one said period of a bit cell and having a level during the last period of time equal to said level during said initial period of time.

11. A frame synchronizing system as in claim 10, wherein said unique pattern includes a portion with a period of time equal to two and a half times said period of a bit cell and which occurs between two sequential level transitions and a second portion with a period of time equal to two, two and a half or three items said period of a bit cell and which occurs between the next two sequential level transitions.

12. A frame synchronizing system as in claim 10, wherein said unique pattern includes a portion with a period of time longer than three times said period of a bit cell and which occurs between two sequential level transitions.

13. A frame synchronizing system as in claim 9, wherein said means for generating includes means for generating a synchronizing pattern to form said frame synchronizing signal, means for encoding said synchronizing pattern into encoded data including said unique pattern, and means for inserting said encoded data into said $M^2$ coded data stream.

14. A frame synchronizing system as in claim 13, wherein said synchronizing pattern includes a synchronizing data pattern with a predetermined number of bits, "0" data preceding said synchronizing data pattern, and a control bit arranged between said "0" data and said synchronizing data pattern, the control bit having a level depending on a DSV (digital sum Variation) at a starting point of said synchronizing data pattern.

15. A frame synchronizing system as in claim 14, wherein said means for encoding the synchronizing data pattern produces a portion with a period of time equal to two and a half times said period of a bit cell and which occurs between two sequential level transitions followed by a second portion with a period of time equal to two, two and a half or three times said period of a bit cell and which occurs between two sequential level transitions.

16. A frame synchronizing system as in claim 14, wherein said frame synchronizing signal has a total period longer than three.

* * * * *